United States Patent
Stathopoulos et al.

(10) Patent No.: US 6,494,729 B1
(45) Date of Patent: Dec. 17, 2002

(54) INSERTION AND EXTRACTION AID FOR PRINTED CIRCUIT CARD

(75) Inventors: Emmanuel Stathopoulos, Montreal (CA); Dorinel Patriche, Chateauguay (CA); Daniel Tassé, Montreal (CA)

(73) Assignee: Hyperchip Inc., Montreal (CA)

( * ) Notice: Subject to any disclaimer, the term of this patent is extended or adjusted under 35 U.S.C. 154(b) by 0 days.

(21) Appl. No.: 09/871,942

(22) Filed: Jun. 4, 2001

(51) Int. Cl.$^7$ ................................................ H01R 13/62
(52) U.S. Cl. ...................................... 439/160; 439/372
(58) Field of Search ............................... 439/157, 153, 439/160, 372, 64

(56) References Cited

U.S. PATENT DOCUMENTS

| | | | | |
|---|---|---|---|---|
| 3,952,232 A | * | 4/1976 | Coules | 317/101 |
| 4,214,800 A | * | 7/1980 | Hollyday et al. | 339/45 |
| 4,233,646 A | | 11/1980 | Leung et al. | |
| 4,313,150 A | | 1/1982 | Chu | |
| 4,632,588 A | | 12/1986 | Fitzpatrick | |
| 4,973,255 A | * | 11/1990 | Rudoy | 439/157 |
| 4,975,073 A | | 12/1990 | Weisman | |
| 5,191,970 A | * | 3/1993 | Brockway et al. | 200/335 |
| 5,389,000 A | * | 2/1995 | DiViesti et al. | 439/157 |
| 5,672,069 A | * | 9/1997 | Cheng et al. | 439/160 |
| 5,730,611 A | * | 3/1998 | Cheng et al. | 439/160 |
| 5,957,708 A | * | 9/1999 | Lin | 439/157 |
| 5,980,282 A | * | 11/1999 | Cheng | 439/157 |
| 6,058,579 A | | 5/2000 | Brocklesby et al. | |
| 6,113,404 A | * | 9/2000 | Choy | 439/160 |
| 6,128,198 A | * | 10/2000 | Kurrer et al. | 361/759 |
| 6,227,887 B1 | * | 5/2001 | Choy | 439/160 |
| 6,244,879 B1 | * | 6/2001 | Liu | 439/152 |
| 6,250,938 B1 | * | 6/2001 | Tung | 439/160 |
| 6,267,614 B1 | * | 7/2001 | Good et al. | 439/327 |
| 6,276,950 B1 | * | 8/2001 | Yodogawa | 439/160 |
| 6,287,134 B1 | * | 9/2001 | Liao | 439/160 |

* cited by examiner

*Primary Examiner*—Tho D. Ta
*Assistant Examiner*—Edwin A. León

(57) ABSTRACT

A PCB insertion and extraction device includes a latching lever carrying a latch adapted to cooperate with a catch to latch the lever in an insertion position thereof. The latch is received in a hole extending through the lever and has an operating end which can be manually operated from a front side of the lever to pivot the latch relative to the lever. The catch is defined in the PCB assembly. A switch is provided in the catch so as to be triggered by the latch when the same is positively engaged with the catch.

17 Claims, 1 Drawing Sheet

INSERTION AND EXTRACTION AID FOR PRINTED CIRCUIT CARD

BACKGROUND OF THE INVENTION

1. Field of the Invention

The present invention relates to a device for aiding a printed circuit board (PCB) to be inserted into, extracted from, and retained in an associated PCB channel.

2. Description of the Prior Art

Devices which can be mounted on a printed circuit board or card in order to assist in the insertion and removal of the board from an associated receptacle of an electronic equipment are known in the art.

For instance, U.S. Pat. No. 4,975,073 issued on Dec. 4, 1990 to Weisman discloses an insertion and extraction aid comprising a lever pivotally mountable to a printed circuit card for pivotal movement with respect thereto is adapted to engage a channel of a piece of electronic equipment selectively between a locked position and an extraction position. A latch is pivotally mounted on the lever and extends rearwardly therefrom for engagement with a catch extending laterally outwardly from one side of the printed circuit card. The latch is manually operated for locking and releasing the lever by pressing a leaf spring provided at one end of the latch against a back surface of the lever, thereby allowing the lever to be disengaged from the channel and the card to then be released therefrom. In some instances, depending on the proximity of the equipment components next to the lever, it might be difficult to have access to the back surface of the lever in order to operate the latch.

Furthermore, it has been found that there is a need for a new latching device which would confirm that the printed circuit board has been fully inserted into its associated receptacle.

SUMMARY OF THE INVENTION

It is therefore an aim of the present invention to provide a printed circuit board insertion and extraction aid which offers ease of operation.

It is also an aim of the present invention to provide such an aid which can be operated from a front side thereof.

It is a further aim of the present invention to provide such an aid which is relatively simple and economical to manufacture.

It is a still further aim of the present invention to provide such an extraction and insertion aid that provides a feedback to the user to insure proper insertion of the PCB into an associated PCB holder.

Therefore, in accordance with the present invention, there is provided an insertion/extraction aid for use with a printed circuit board (PCB), comprising a lever adapted to be pivotally mounted to a PCB for movement relative thereto between an insertion position and an extraction position. The lever has opposed front and back sides. The back side generally faces the PCB. A latch is mounted to the lever and has a catch engaging portion extending beyond the back side of the lever for releasably latching the same in the insertion position. An actuator is provided for displacing the catch engaging portion between latched and released positions relative to the lever. The actuator is located on the front side of the lever for allowing the latch to be operated from the front side of the lever.

In accordance with a further embodiment of the present invention, there is provided an insertion/extraction aid in combination with a printed circuit board (PCB) assembly comprises a faceplate adapted to be secured to a PCB and defining a catch, said aid comprising a lever adapted to be pivotally mounted to one of said PCB and said faceplate for movement relative thereto between an insertion position and an extraction position, a latch mounted to said lever for engagement with said catch of said faceplate in order to releasably latch the lever in the insertion position thereof, said latch being displaceable relative to said lever between a latched position and a released position wherein said latch disengages from said catch.

In accordance with a further general aspect of the present invention, there is provided an insertion/extraction aid for use with a printed circuit board (PCB), comprising a lever adapted to be pivotally mounted to a PCB for movement relative thereto between an insertion position and an extraction position, a catch adapted to be mounted to the PCB, a latch mounted to the lever for engagement with the catch in order to releasably latch the lever in the insertion position thereof, the latch being displaceable relative to the lever between a latched position and a released position wherein the latch disengages from the catch, and a switch for detecting a state of the latch relative to the catch.

BRIEF DESCRIPTION OF THE DRAWINGS

Having thus generally described the nature of the invention, reference will now be made to the accompanying drawings, showing by way of illustration a preferred embodiment thereof, and in which.

DESCRIPTION OF THE PREFERRED EMBODIMENTS

Figure 1:
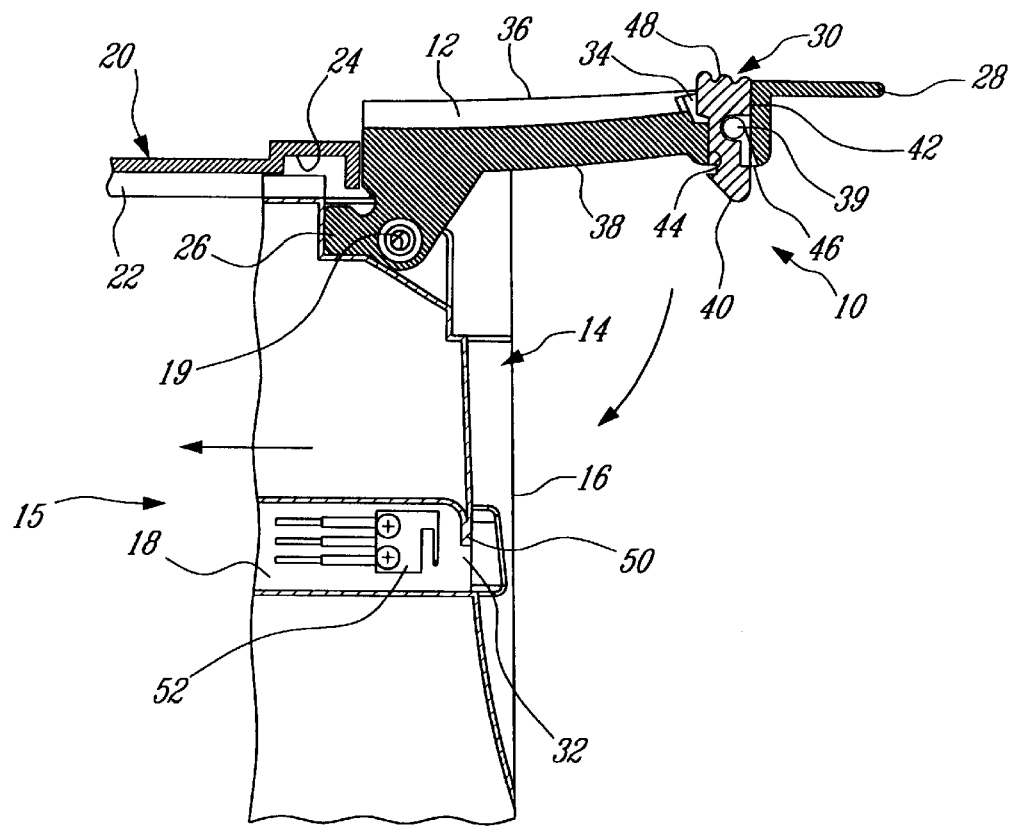
FIG. 1 is a side cross-sectional view of an insertion and extraction device mounted to a printed circuit board (PCB) in the process of being inserted into a mating frame of an electronic equipment in accordance with a first embodiment of the present invention.

Now referring to the drawings, and in particular to FIG. 1, an insertion and extraction aid for printed circuit boards (PCB) embodying the elements of the present invention and generally designated by numeral 10 will be described.

The insertion and extraction aid 10 is adapted to be used in connection with a PCB assembly 15 including a PCB 18 and a faceplate 16. In accordance with an embodiment of the present invention, the insertion and extraction aid 10 includes a lever 12 adapted to be pivotally mounted in a cutout portion 14 defined in the faceplate 16 of the PCB assembly 15. The lever 12 is mounted on a pivot pin 19 adjacent a front edge of the PCB 18 opposite a rear edge (not shown) thereof carrying electrical connectors (not shown) for mating engagement with corresponding connectors (not shown) provided at a rear end of a PCB receiving channel of an electronic device that is partly shown at 20. The electronic device 20 includes a frame 22 in which the PCB receiving channel is defined for slidably receiving the PCB assembly 15. The frame 22 further defines a front inverted U-shaped recess 24 in which a cam portion 26 of the lever 12 is engageable for slidably displacing the PCB assembly 15 in and out of the PCB receiving channel in response to a pivotal movement of the lever 12 about the pivot pin 19. It is noted that the U-shaped recess 24 could be replaced by a cut-out defined in the frame 22 or by any other suitable bearing surface for the cam portion 26.

Figure 2:
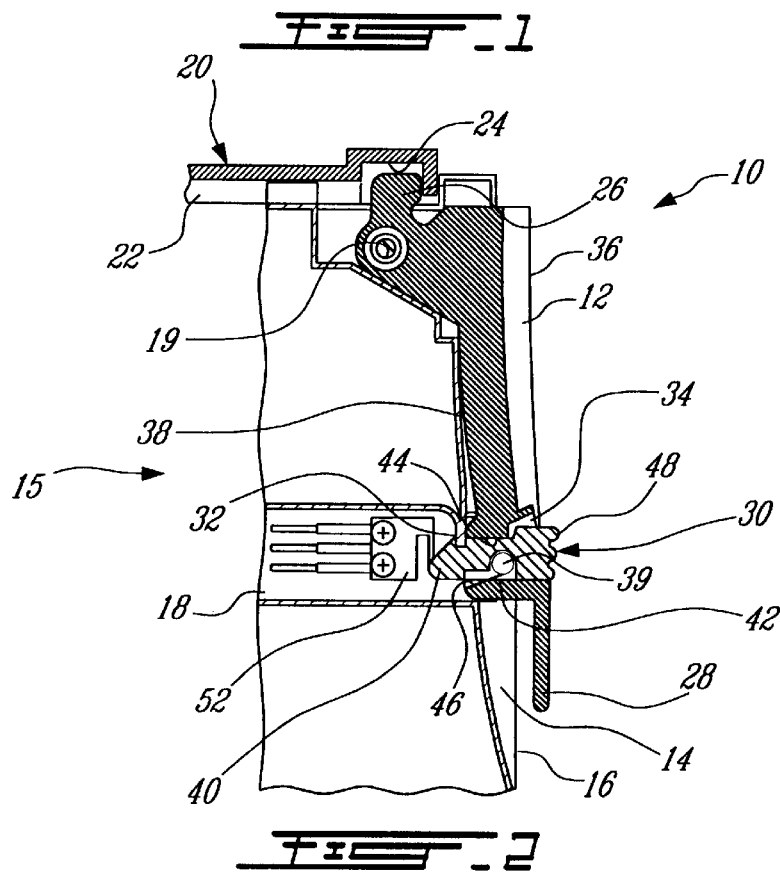
FIG. 2 is a side cross-sectional view of the device of FIG. 1 shown with the PCB in a fully inserted position.

The lever 12 is provided at an outer end thereof opposite its cam portion 26 with a handle portion 28 which can be grasped by an operator for manually pivoting the lever 12 between the positions illustrated in FIGS. 1 and 2.

The lever 12 carries a latch 30 adapted to engage a catch 32 defined in the faceplate 16 of the PCB assembly 15 in order to releasably lock the lever 12 in its fully inserted position, as illustrated in FIG. 2.

The latch 30 is received in a hole 34 extending through the lever 12 from a front side 36 thereof to a back side 38 thereof. The latch 30 is pivotally mounted on a pivot pin 39 extending across the hole 34. The latch 30 is provided, at one end, with a hook portion 40 projecting outwardly of the hole 34 and rearwardly of the back side 38 of the lever 12. The hook portion 40 automatically latches to the catch 32 when the lever 12 is pivoted to its insertion position, as illustrated in FIG. 2. A torsion spring 42 is provided in the hole 34 about the pivot pin 39 for normally urging the latch 30 to a latched position against a top planar arresting surface 44 defined in the hole 34. A downwardly sloping surface 46 diverges rearwardly away from the top arresting surface 44 for providing enough clearance in the hole 34 to allow the latch 30 to be pivoted against the biasing force of the torsion spring 42 towards a released position.

The latch 30 is further provided at one end thereof, opposite the hook portion 40, with an integral actuating portion 48. The actuating portion 48 is provided at the front side 36 of the lever 12 for allowing the latch 30 to be conveniently operated from the front side of the lever 12 while the operator is holding the handle portion 28 thereof. For instance, the latch 30 can be operated by placing the thumb on the actuating portion 48 while the remaining fingers of the operator's hand hold the handle portion 28. The frontal operation of the latch 30 is particularly advantageous in situations where access to the rear side of the lever 12 is rendered difficult due to the proximity of surrounding structures. The frontal surface of the actuating portion 48 is ribbed to facilitate the operation of the latch 30 by the operator using only one of his/her fingers.

The catch 32 is formed by a recess defined in the faceplate 16 of the PCB assembly 15 and includes a frontal downwardly depending finger 50 over which the hook portion 40 of the latch 30 is adapted to extend to latch the lever 12 in its insertion position, as illustrated in FIG. 2. Alternatively, the catch 32 could be provided directly on the PCB 18.

A switch 52 is mounted on one side of the PCB 18 rearwardly of the downwardly depending finger 50 so as to be triggered by the latch 30 when the same is positively engaged with the catch 32. The switch 52 can be operatively connected to a control system (not shown) and a display (not shown) to provide a feedback that the PCB assembly 15 has been fully levered into an associated PCB receiving channel of the electronic device 20. The relative position of the actuating portion 48 within the hole 34 may also provide an indication of the relative position of the latch 30 and the catch 32 as, if the actuating portion 48 is in a raised position, its hook portion 40 is not yet completely behind the finger 50 of the catch 32.

When it is desired to extract the PCB assembly 15 from its associated PCB receiving channel, the operator has first to manually upwardly pivot the actuating portion 48 of the latch 30 against the biasing force of the spring 42 so as to lower the hook portion 40 so that it clears the downwardly depending finger 50, thereby allowing counterclockwise pivot of the lever 12 about pivot pin 19. During this movement of the lever 12, the cam portion 26 presses against the front inner wall of the inverted U-shaped channel 24 to force the PCB assembly 15 away from its fully inserted position.

It is understood that a second insertion/extraction aid similar to that shown on FIGS. 1 and 2, can be inverted and mounted to the PCB assembly 15 at a lower front end thereof. It is also understood that the insertion/extraction aid 10 could be used with a horizontally oriented PCB, as opposed to the vertically oriented one as described hereinabove.

What is claimed is:

1. An insertion/extraction aid for use with a printed circuit board (PCB) assembly, comprising a lever adapted to be pivotally mounted to a PCB assembly for movement relative thereto between an insertion position and an extraction position, said lever having opposed front and back sides, a latch mounted to said lever, said latch having an actuator and a catch engaging portion extending beyond said back side of said lever for releasably latching the lever in the insertion position thereof, said actuator for displacing said catch engaging portion between latched and released position relative to said lever, said back side generally facing the PCB assembly in said latched position, wherein said actuator is located on said front side of said lever, thereby allowing said latch to be operated from said front side.

2. An insertion/extraction aid as defined in claim 1, wherein said latch extends transversally through said lever at least from said front side to said rear side.

3. An insertion/extraction aid as defined in claim 2, wherein said latch is pivotally mounted to said lever between said front and rear sides thereof, and wherein said latch is spring biased to said latched position.

4. An insertion/extraction aid as defined in claim 2, wherein a hole extends through said lever from said front side to said rear side for receiving said latch, and wherein said actuator is a one finger operated actuator.

5. An insertion/extraction aid as defined 1, wherein said actuator is located in an hole defined in said front side of said lever.

6. An insertion/extraction aid as defined in claim 5, wherein said actuator is integral to said latch and provided at a front end thereof.

7. An insertion/extraction aid as defined in claim 1, further including a catch provided on a faceplate of the PCB assembly, said catch being adapted to cooperate with said catch engaging portion of said latch to releasably latch said lever in said insertion position.

8. An insertion/extraction aid as defined in claim 7, further including a switch positioned to be triggered by said catch engaging portion of said latch when said lever is displaced to said insertion position thereof and said latch is positively engaged with the catch.

9. An insertion/extraction aid as defined in claim 7, wherein said catch is formed by a recess defined in the faceplate.

10. An insertion/extraction aid as defined in claim 9, wherein a finger is provided at a mouth of said recess for hook engagement with said catch engaging portion.

11. An insertion/extraction aid in combination with a printed circuit board (PCB) assembly comprises a faceplate adapted to be secured to a PCB and defining a catch, said aid comprising a lever adapted to be pivotally mounted to one of said PCB and said faceplate for movement relative thereto between an insertion position and an extraction position, a latch mounted to said lever for engagement with said catch of said faceplate in order to releasably latch the lever in the insertion position thereof, said latch being displaceable relative to said lever between a latched position and a released position wherein said latch disengages from said catch.

12. The combination as defined in claim 11, wherein a switch is mounted rearwardly of said faceplate so as to be triggered by said latch when the same is engaged with said catch to provide a feedback that said lever is fully displaced to said insertion position thereof and that said latch is in said latched position.

13. The combination as defined in claim 11, wherein said latch extends from a front side of said lever to a rear side thereof, and wherein said latch has a finger application surface against which a user can apply one of his/her fingers to operate the latch directly from said front side of the lever.

14. The combination as defined in claim 13, wherein said finger application surface of said latch is positioned next to a handle portion of the lever.

15. The combination as defined in claim 13, wherein said latch is received in a hole extending through said lever from said front side to said rear side thereof.

16. The combination as defined in claim 15, wherein said latch is pivotally mounted to a pivot pin extending across said hole.

17. The combination as defined in claim 16, wherein a torsion spring is mounted about said pivot pin to bias said latch to said latched position.

* * * * *